March 24, 1964 M. M. STERN 3,126,490
HIGH CURRENT PULSE DRIVER USING DARLINGTON CIRCUIT
Filed May 3, 1961 2 Sheets-Sheet 1

INVENTOR.
MICHAEL M. STERN
BY F. J. Sullivan
ATTORNEY

INVENTOR.
MICHAEL M. STERN
BY F. L. Sullivan
ATTORNEY 3,126,490

HIGH CURRENT PULSE DRIVER USING DARLINGTON CIRCUIT

Michael M. Stern, Brookline, Mass., assignor to Sylvania Electric Products Inc., a corporation of Delaware
Filed May 3, 1961, Ser. No. 107,551
2 Claims. (Cl. 307—88.5)

This invention is concerned with transistorized electronic circuits, and particularly with high speed, high current, pulse drivers.

For some applications, such as the operation of magnetic core memories with a desired read-write memory cycle of the order of one microsecond, circuits capable of driving several hundred milliampere pulses with rise and fall times of only a few millimicroseconds are required. Hitherto, current pulses for this type of purpose have generally been produced with circuits which have internal delays due to transistor storage and which experience slow current pulse fall times if they are designed for fast rise and vice versa.

Accordingly, a primary object of this invention is to provide an improvement in current pulse circuits. A more specific object is to provide an improved high current, high speed, pulse driver.

These and related objects are accomplished in one embodiment of the invention by utilizing a unique combination of two transistors in a pulse generating circuit with a common inductive biasing circuit so that one transistor, which has a relatively short duty cycle, conducts first to provide the fast rise time desired and the other, which carries the major portion of the current pulse, also controls the fall time.

Figure 1:
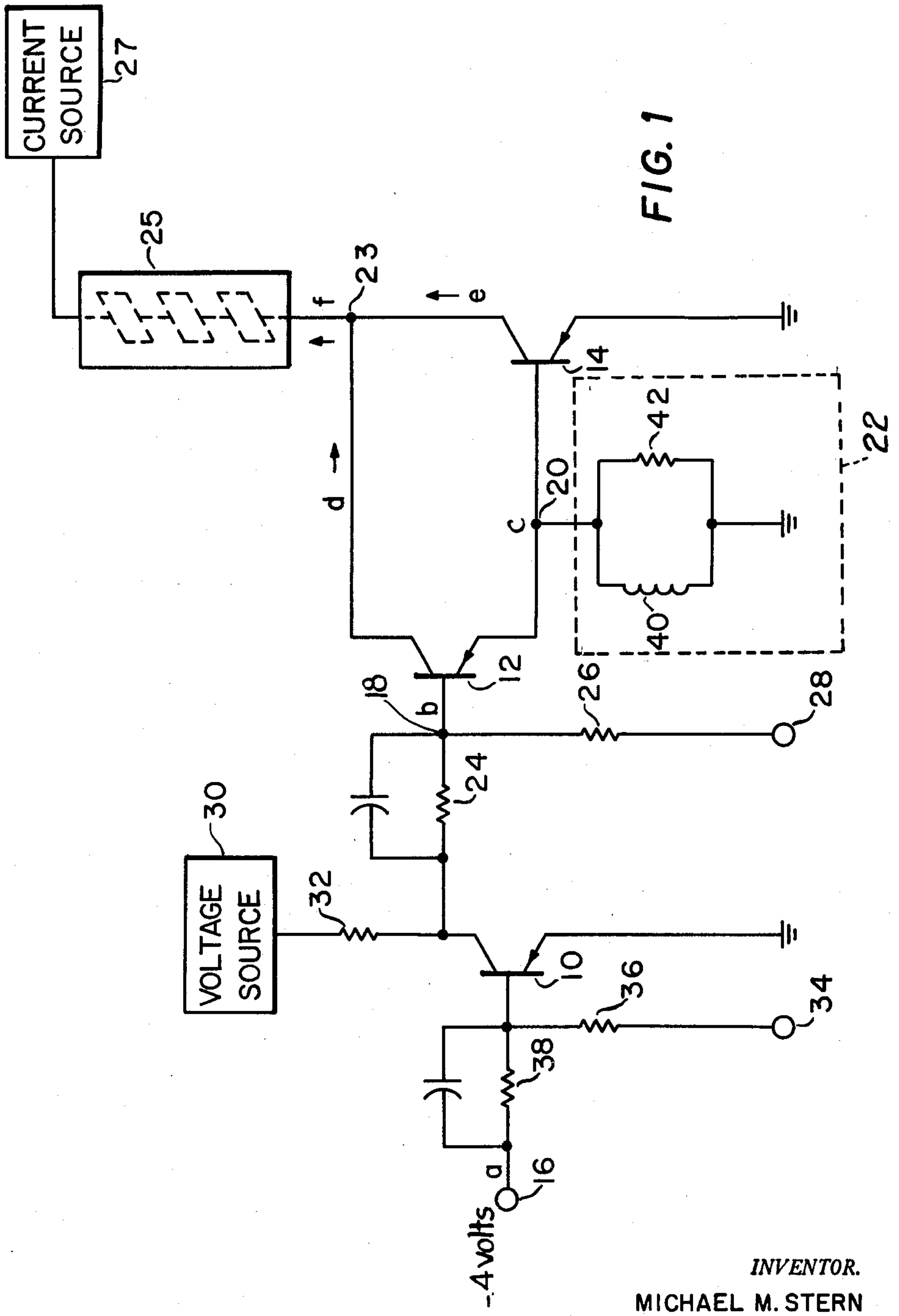

The operation of this illustrative embodiment and other objects, features, and modifications of the invention will be more apparent from the following description with reference to the accompanying drawings, wherein:

FIG. 1 is a schematic representation of a pulse driver embodying the invention; and, FIGS. 2*a–f* are a series of diagrammatic current pulses at different points in the circuit of FIG. 1.

Referring to FIG. 1, the illustrative embodiment of the invention to be described features three transistors 10, 12, and 14 with appropriate input, output, and biasing circuitry. Transistor 10 serves the function of an input stage to the driving pulse generator comprised of transistors 12 and 14. Although only a single input transistor 10 is shown, it is to be understood that this is merely representative of any typical input stage such as conventional INVERTER, AND, OR, NOR, etc. gates or matrixing arrangements. In the circuit shown, transistor 10 inverts the square wave input signal *a* (FIG. 2*a*) arriving at terminal 16 into the waveform *b* at terminal 18 where it provides the bias *b* for transistor 12 and in combination with inductive circuit 22, since transistor 12 is utilized as an emitter follower connected into the base of transistor 14, also provides the bias *c* at terminal 20 for that transistor. In a manner to be explained in more detail below, the response to this biasing is a slow rise with fast fall *d* for transistor 12 and a fast current rise with short duty cycle *e* for transistor 14. These combine to produce the fast rise-fast fall output pulse *f* at the circuit output terminal 23. For purposes of illustration, this current pulse is shown as being drawn through the inductive load 25 of a row of memory cores from a current source 27.

The circuit is quiescently operated with transistor 12 biased "off" with a +1.8 v. at terminal 18. This biasing potential is derived from terminal 28 through the voltage divider of resistors 24 and 26 when transistor 10 presents a very low impedance to ground. When transistor 10 is cut off by the presence of a positive going pulse *a* at terminal 16, current flows from transistor 12's base to source 30 via resistor 32. Thus, transistor 12 becomes conductive and a negative going voltage spike is produced at the leading edge of the resulting waveforms *b* and *c* at terminals 18 and 20, respectively. When the circuit is quiescently operated, transistor 14 is biased off by inductive circuit 22, which is comprised of an inductor 40 connected in shunt with a resistor 42, to ground. During operation, with a positive going input pulse *a* at input terminal 16, the inductive circuit 22 causes transistor 14 to turn on with an extremely fast rise in current due to the negative spike at terminal 20. This spike has the opposite effect on transistor 12, however, because it appears at its emitter as well as at its base. As a consequence of transistor 14 conducting, a fast rising current pulse *e* flows into the circuit output terminal 23. This pulse, as demonstrated by FIGS. 2*d–f*, combines, as explained below, with a slow rising current pulse *d* through transistor 12 to produce the substantially square output pulse *f*.

This output pulse, at the outset has approximately 90% of its current carried by transistor 14 and 10% by transistor 12, and its rise time is almost completely controlled by the characteristics of transistor 14. As the inductor 40, however, starts to discharge through the parallel combination of resistor 42 and the base-emitter resistance of transistor 14, this transistor carries less current until it finally turns off when the inductor has discharged completely and has become in effect a short circuit to ground across both the resistor 42 and the base-emitter junction of transistor 14. Meanwhile, transistor 12 starts to carry more current as inductor 40 discharges, since its emitter is moving toward ground potential and its base is held at the positive potential drop across resistor 26, until it is carrying all of the output current.

Figure 2:
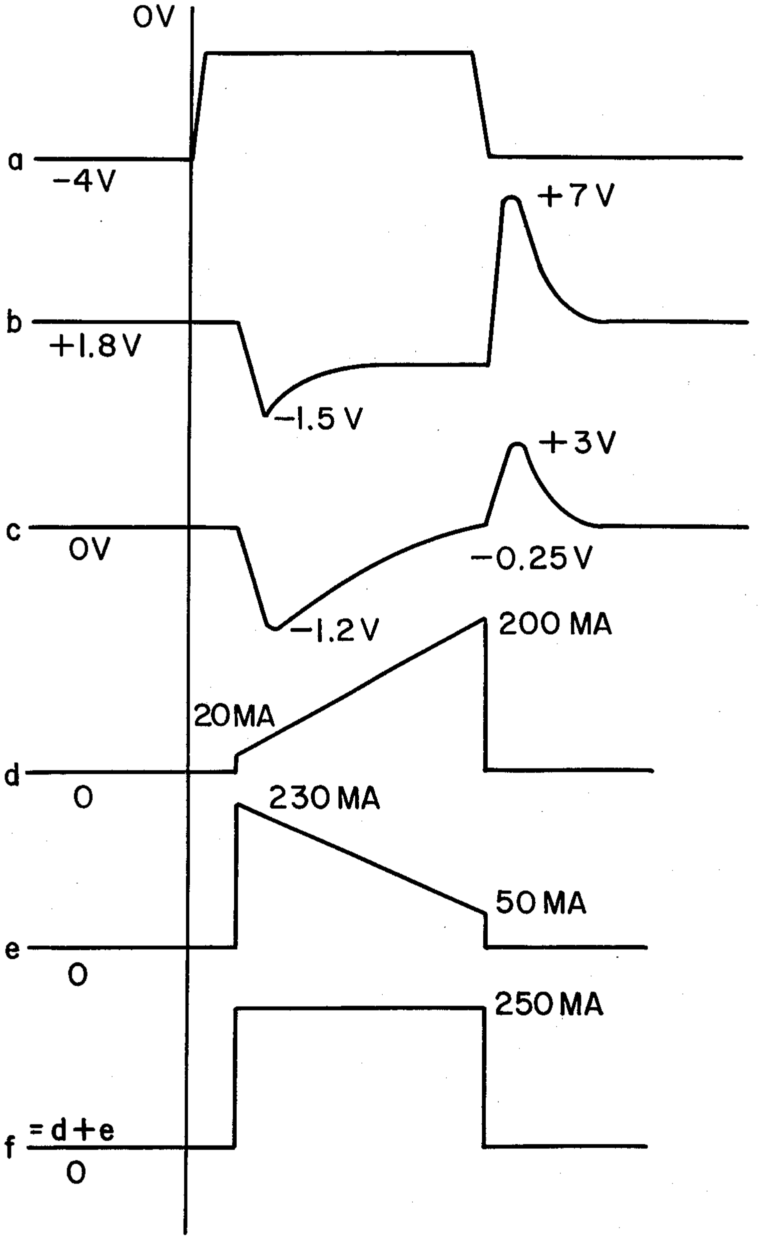

When the input pulse *a* returns to a negative 4 volts where it cuts off transistor 10, a large positive voltage spike is produced by inductive circuit 22 at terminals 18 and 20 (see FIGS. 2*b* and 2*c*). Since the spike appears at both the base and emitter of transistor 12, this transistor cuts off immediately. If the negative inductive spike had completely discharged before the input pulse terminated, transistor 14 would have been already cut off before the positive spike occurred and output pulse fall time would be controlled entirely by transistor 12. If, however, the negative spike had not been completely discharged, the large positive signal on its base would turn transistor 14 off immediately and transistor 12 would still control the fall time of the output pulse. A resistor may be added to the circuit, between terminal 23 and the collector of transistor 14 to minimize power dissipation.

Thus, the circuit which has been described avoids transistors storage problems in providing a high speed, high current, pulse. It has been employed in a magnetic core memory system operating on a one microsecond read-write cycle where it produced 300 milliampere pulses with 30 millimicrosecond rise and fall times utilizing the following combination of circuit elements:

| | |
|---|---|
| Transistor **10** | 2N501. |
| Transistor **12** | 2N1384. |
| Transistor **14** | 2N501. |
| Resistor **24** | 560Ω. |
| Resistor **26** | 560Ω. |
| Resistor **32** | 390Ω. |
| Resistor **36** | 3.9K. |
| Resistor **38** | 1.2K. |
| Inductor **40** | 1.5μ h. |
| Resistor **42** | 47Ω. |
| Load resistor in collector circuit of transistor **14** (if used) | 2.7. |
| Input *a* | Pulses rising from −3.5 v. to 0 v. |
| Potential at terminals **28** and **34** | +4 v. |
| Potential at sources **27** and **30** | −15 v. |

Although the circuit has been described as employed to drive an inductive load such as a row of memory cores, as indicated by reference character 25, it may also be employed in other applications such as the production of wide current pulses with extremely fast rise time where its characteristic of avoiding transistor storage delays and other difficulties, by employing a short duty cycle, fast turn-on, transistor in combination with a second transistor having a relatively heavy duty cycle to carry the major share of the current pulse and control its fall time, shows up to good advantage. For this purpose the following combinations of the transistors in pulse driver have produced the results indicated with very favorable rise and fall times, uniform minimum delay between the leading edge of the input and output pulses and substantially uniform and minimum delay in trailing edge.

| Transistor 10 | Transistor 12 | Transistor 14 | Rise time, mμsec. | Fall time, mμsec. | Delay on, mμsec. | Delay off, mμsec. |
|---|---|---|---|---|---|---|
| 2N501 | 2N1384 | 2N501 | 30 | 30 | 20 | 30 |
| 2N501 | 2N501 | 2N1384 | 30 | 20 | 20 | 20 |
| 2N501 | 2N1384 | 2N1384 | 50 | 20 | 20 | 20 |
| 2N501 | 2N501 | 2N501 | 30 | 30 | 20 | 20 |
| 2N501 | 2N428 | 2N501 | 50 | 70 | 20 | 40 |
| 2N501 | 2N428 | 2N1384 | 60 | 60 | 20 | 40 |
| 2N501 | 2N1384 | 2N428 | 70 | 30 | 20 | 40 |
| 2N501 | 2N501 | 2N428 | 45 | 30 | 20 | 20 |
| 2N501 | 2N428 | 2N428 | 70 | 40 | 20 | 40 |

The invention is not limited to the specific features shown and described but embraces the full scope of the following claims.

What is claimed is:

1. A high speed, high current, pulse driving circuit comprising: a current source; first and second transistors each having collector, base and emitter electrodes; an output terminal connected to said current source and said collectors of said first and second transistors; means connecting the emitter of said first to the base of said second transistor; a source of reference potential; means connecting the emitter of said second transistor to said source of reference potential; an input circuit connected to the base of said first transistor; and, an inductive circuit connected between said source of reference potential and said emitter-base connection, said inductive circuit consisting solely of a resistor by-passed by an inductor.

2. A high speed, high current, pulse driving circuit comprising: a source of input signal pulses; a current source; first and second transistors each having collector, base, and emitter electrodes; an output terminal connecting both of said collectors to said current source; an inductive circuit consisting solely of a resistor shunted by an inductor; means connecting said input signal pulse source to the base of said first transistor; a source of reference potential connected to the emitter of said second transistor and to said inductive circuit; and, a common terminal connected to the emitter of said first transistor, the base of said second transistor and said inductive circuit whereby a rise in current at said signal input produces a voltage spike at said common terminal to cause said second transistor to conduct current with a fast rise time from said source to said reference potential and, as said voltage spike dissipates through said shunted resistor, to cause said second transistor to become less conductive and said first transistor to become more conductive.

References Cited in the file of this patent

UNITED STATES PATENTS

| | | |
|---|---|---|
| 2,663,806 | Darlington | Dec. 22, 1953 |
| 2,983,875 | Zechter | May 9, 1961 |
| 3,039,009 | Gray et al. | June 12, 1962 |